(12) United States Patent
Kondo

(10) Patent No.: US 12,072,390 B2
(45) Date of Patent: Aug. 27, 2024

(54) METHODS AND APPARATUS FOR DETECTING BATTERY CELL IMBALANCE

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 767 days.

(21) Appl. No.: 16/793,660

(22) Filed: Feb. 18, 2020

(65) Prior Publication Data

US 2021/0255252 A1 Aug. 19, 2021

(51) Int. Cl.
*G01R 31/396* (2019.01)
*G01R 31/3842* (2019.01)
*G01R 31/389* (2019.01)
*H01M 10/42* (2006.01)
*H01M 10/48* (2006.01)
*H02J 7/00* (2006.01)

(52) U.S. Cl.
CPC ....... *G01R 31/396* (2019.01); *G01R 31/3842* (2019.01); *G01R 31/389* (2019.01); *H01M 10/425* (2013.01); *H01M 10/482* (2013.01); *H02J 7/0048* (2020.01); *H01M 2010/4278* (2013.01)

(58) Field of Classification Search
CPC ......... B60L 2240/545; B60L 2240/547; B60L 2240/549; B60L 58/15; B60L 58/22; H02J 7/0014; H02J 7/0016; H02J 7/0021; H02J 7/0048
See application file for complete search history.

(56) References Cited

U.S. PATENT DOCUMENTS

| | | | |
|---|---|---|---|
| 2011/0112781 A1* | 5/2011 | Anderson | G01R 31/392 702/63 |
| 2013/0002200 A1 | 1/2013 | Kobayashi | |
| 2013/0063094 A1* | 3/2013 | Gibbs | B60L 50/62 320/134 |
| 2014/0361743 A1* | 12/2014 | Lin | H02J 7/0021 320/109 |
| 2015/0165921 A1 | 6/2015 | Paryani | |
| 2015/0357852 A1* | 12/2015 | Nakao | B60L 58/12 320/162 |
| 2017/0163060 A1* | 6/2017 | Zheng | H02J 7/0019 |
| 2017/0370995 A1* | 12/2017 | Huang | G01R 31/387 |
| 2018/0115024 A1 | 4/2018 | Sugeno | |
| 2019/0146039 A1* | 5/2019 | Schmidt | G01R 1/203 324/430 |
| 2020/0284841 A1* | 9/2020 | Moon | G01R 31/3842 |

\* cited by examiner

*Primary Examiner* — Kyle R Quigley

(74) *Attorney, Agent, or Firm* — Dickinson Wright PLLC; Jonathan A. Schnayer

(57) ABSTRACT

Various embodiments of the present technology may provide methods and apparatus for detecting battery cell imbalance. The apparatus may provide a fuel gauge circuit to detect imbalance in a battery pack with two series-connected battery cells and determine the amount of imbalance using only the positive and negative terminal of the battery pack.

7 Claims, 9 Drawing Sheets

| RSOC [%] | RESISTANCE [m ohm] (LOAD=1C) | RESISTANCE [m ohm] (LOAD=0.5C) |
|---|---|---|
| 7 | 408.9 | 309.9 |
| 8 | 396.6 | 298.1 |
| 9 | 385.8 | 287.8 |
| 10 | 376.1 | 278.6 |
| 11 | 367.3 | 270.2 |
| 12 | 359.3 | 262.6 |
| 13 | 351.9 | 255.6 |
| 14 | 345.1 | 249.1 |
| 15 | 338.7 | 243.0 |
| 16 | 332.8 | 237.4 |
| 17 | 327.2 | 232.0 |
| 18 | 322.0 | 227.0 |
| 19 | 317.0 | 222.3 |
| 20 | 312.3 | 217.8 |
| 21 | 307.8 | 213.5 |
| 22 | 303.5 | 209.4 |
| 23 | 299.4 | 205.5 |
| 24 | 295.5 | 201.8 |
| 25 | 291.7 | 198.2 |
| 26 | 288.1 | 194.8 |
| 27 | 284.6 | 191.5 |
| 28 | 281.3 | 188.3 |
| 29 | 278.1 | 185.2 |
| 30 | 274.9 | 182.2 |
| 31 | 271.9 | 179.4 |
| 32 | 269.0 | 176.6 |
| 33 | 266.2 | 173.9 |
| 34 | 263.4 | 171.3 |

FIG.8

METHODS AND APPARATUS FOR DETECTING BATTERY CELL IMBALANCE

BACKGROUND OF THE TECHNOLOGY

Battery-powered systems may include a battery pack with two or more series-connected battery cells. In some cases, the battery cells may be imbalanced, which could lead to dangerous operating conditions, such as over-charging and over-discharging. Conventional systems require a connection point located between two battery cells to monitor the voltage of each cell. This configuration, however, requires extra circuitry and increases the cost of the system.

SUMMARY OF THE INVENTION

Various embodiments of the present technology may provide methods and apparatus for detecting battery cell imbalance. The apparatus may provide a fuel gauge circuit to detect imbalance in a battery pack with two series-connected battery cells and determine the amount of imbalance using only the positive and negative terminal of the battery pack.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 is a block diagram of a system in accordance with an exemplary embodiment of the present technology;

FIGS. 2A-2B representatively illustrate charging a battery pack with two balanced battery cells;

FIGS. 3A-3B representatively illustrate discharging a battery pack with two balanced battery cells;

FIGS. 4A-4B representatively illustrate charging a battery pack with two imbalanced battery cells;

FIGS. 5A-5B representatively illustrate discharging a battery pack with two imbalanced battery cells;

FIG. 8 is a table illustrating capacity values and corresponding resistance values at two different load conditions in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, signal converters, semiconductor devices, such as transistors and capacitors, and the like, which may carry out a variety of functions.

Figure 1:
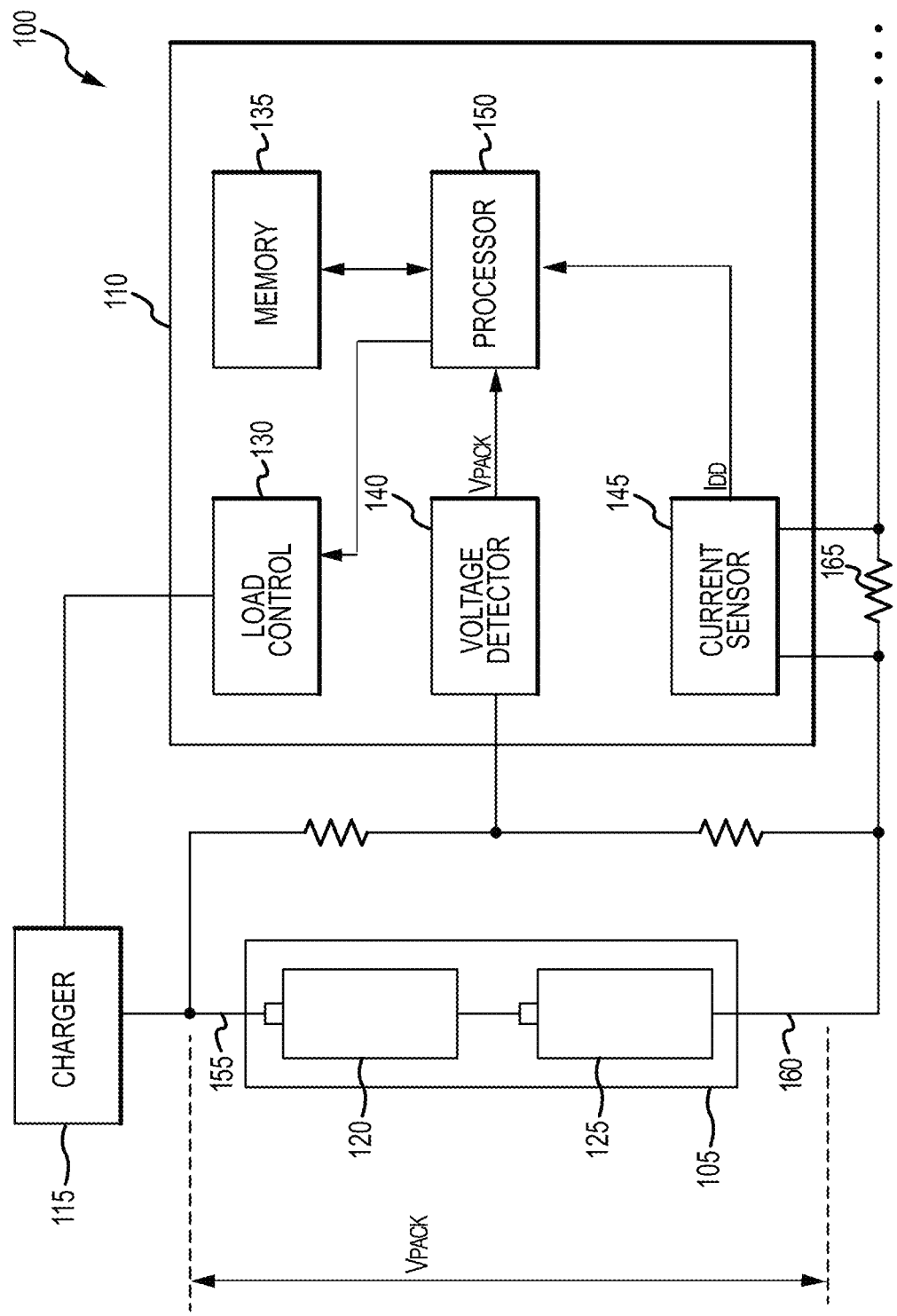

Methods and apparatus for detecting battery cell imbalance according to various aspects of the present technology may operate in conjunction with any suitable battery-powered electronic system and/or device, such as "smart devices," wearables, consumer electronics, portable devices, medical devices, gaming systems, and the like. Referring to FIGS. 1 and 2, an exemplary system 100 may be integrated in an electronic device (not shown), such as an electric drill, powered by a rechargeable battery pack 105. The battery pack 105 may comprise any number of series-connected battery cells. In an exemplary embodiment, the battery pack 105 may comprise a first battery cell 120 connected in series with a second battery cell 125. The first and second battery cells 120, 125 may comprise a lithium-ion type battery cell or any other rechargeable battery type. The battery pack 105 may comprise a first terminal 155 (e.g., a positive terminal) and a second terminal 160 (e.g., a negative terminal. The first battery cell 120 may be directly connected to the first terminal 155 and the second battery cell 125 may be directly connected to the second terminal 160. The system 100 may further comprise a fuel gauge circuit 110 and a charger 115.

The charger 115 may be configured to control charging and discharging of the battery pack 105. The charger 115 may be connected to battery pack 105 and may initiate charging and discharging operations at the direction of the fuel gauge circuit 110. The charger 115 may comprise any circuit and/or system suitable for controlling current supplied to a load (not shown) and current applied to the battery pack 105 for the purpose of charging the battery pack 105.

The fuel gauge circuit 110 may be configured to detect imbalance between the first battery cell 120 and the second battery cell 125. For example, the fuel gauge circuit 110 may be configured to determine a first capacity based on a total voltage $V_{PACK}$ and a first battery characteristic data, compute a first actual resistance $R_{PACK1}$ of the battery pack 105 using the total voltage $V_{PACK}$ and a first load current, and determine whether the computed first actual total resistance $R_{PACK1}$ is equal to a theoretic resistance $R_{TH1}$. If the computed first actual total resistance $R_{PACK1}$ is equal to the theoretic resistance $R_{TH1}$, the first and second battery cells 120, 125 are considered balanced. If the computed first actual total resistance $R_{PACK1}$ is not equal to the theoretic resistance $R_{TH1}$, the first and second battery cells 120, 125 are considered imbalanced. If the battery cells 120, 125 are imbalanced, the fuel gauge circuit 110 may set a range of use of the battery pack 105 that is less than 100% according to the amount of imbalance. In addition, or alternatively, the fuel gauge circuit 110 may perform a cell balancing operation to balance the first and second battery cells 120, 125.

The fuel gauge circuit 110 may be further configured to determine an amount of imbalance between the first battery cell 120 and the second battery cell 125. For example, the fuel gauge circuit 110 may be configured to compute a second actual resistance $R_{PACK2}$ of the battery pack 105 using the total voltage and a second load current, and compute a second capacity of the first battery cell 120 and a third capacity of the second battery cell 125 using the computed first actual resistance $R_{PACK1}$, the computed second actual resistance $R_{PACK2}$, and a set of equations.

In an exemplary embodiment, the fuel gauge circuit 110 may detect the imbalance and determine the amount of imbalance by monitoring only the first and second terminals 155, 160 of the battery pack 105.

The fuel gauge circuit 110 may comprise a voltage detector 140 to measure a total voltage $V_{PACK}$ of the battery pack 105. The total voltage $V_{PACK}$ is the sum of a voltage of the first battery 120 and a voltage of the second battery cell 125. The voltage detector 140 may be connected to the first and second terminals 155, 160 and may comprise any circuit and/or device suitable for measuring a voltage difference between two points.

The fuel gauge circuit 110 may comprise a current sensor 145 to sense or otherwise measure a current of the battery pack 105. The current sensor 145 may comprise any circuit and/or device suitable for measuring the current of the battery 101. For example, the current sensor 155 may operate in conjunction with a sense resistor 165, wherein the current senor 145 measures the voltage across the sense resistor 165 to determine the current.

Figure 7:
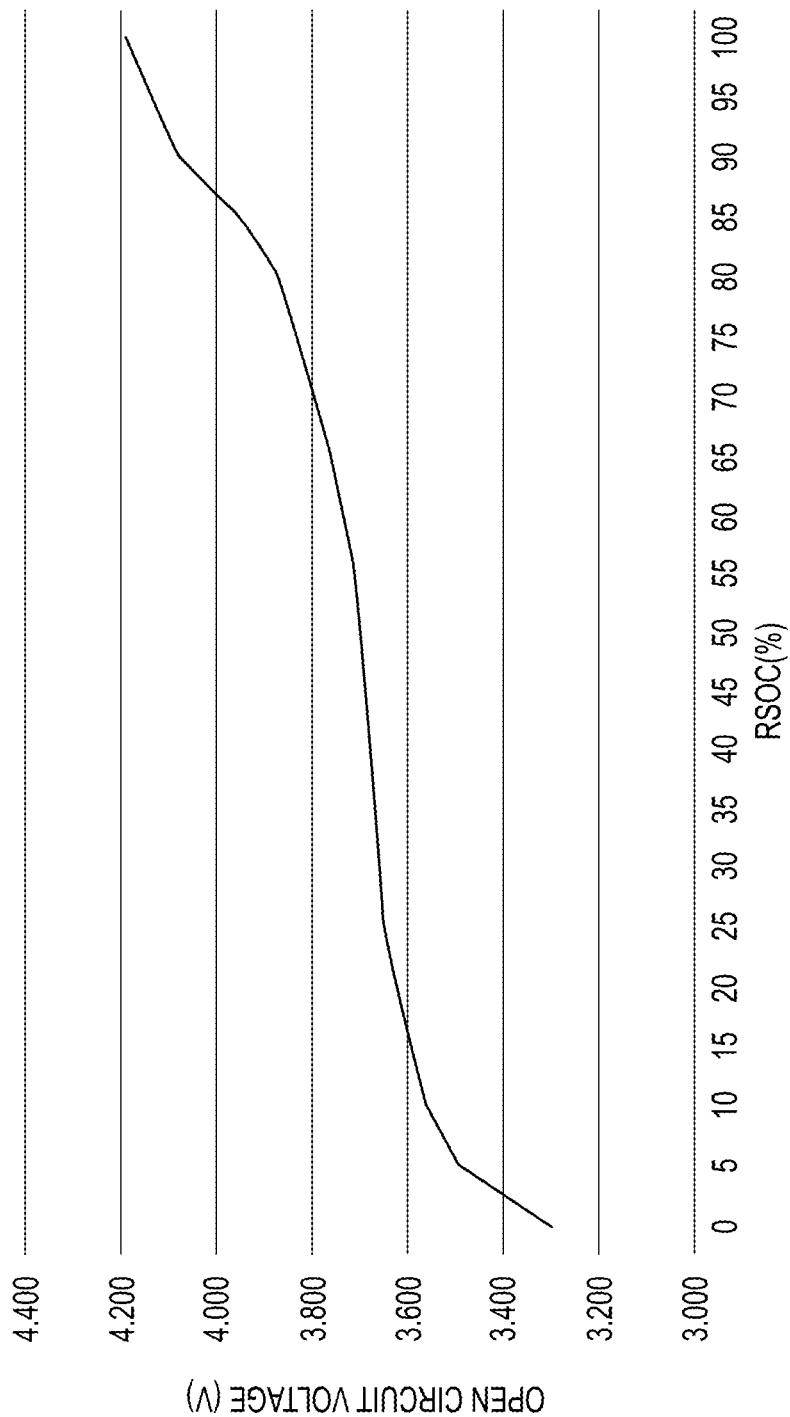
FIG. 7 is a graph illustrating open circuit voltage values as a function of capacity in accordance with an exemplary embodiment of the present technology.

The fuel gauge circuit 110 may further comprise a memory 135 configured to store known battery characteristic data. For example, the memory 135 may store a first battery characteristic data indicating a relationship between open circuit voltage and capacity (e.g., as illustrated in FIG. 7). For example, the first battery characteristic data may be stored in a look-up table or other suitable form. In general, battery capacity may be represented as a percentage and referred to as a relative state of charge (RSOC). In various embodiments, the first battery cell 120 and the second battery cell 125 have identical first battery characteristic data.

The memory 135 may also store a second battery characteristic data indicating a relationship between capacity, internal resistance, and current (e.g., as illustrated in FIG. 8). The second battery characteristic data may be stored in a look-up table or other suitable form.

The fuel gauge circuit 110 may further comprise a processor 150 configured to receive various measured battery data, such as the total voltage $V_{PACK}$ and the current $I_{DD}$. The processor 150 may also be in communication with the memory 135, such as retrieving or receiving known battery characteristic data. The processor 150 may be configured to perform a number of operations to determine if the battery cells 120, 125 are balanced, and if not, the amount of the imbalance. For example, the processor 150 may be configured to determine a first capacity based on the total voltage and the first battery characteristic data, compute the first actual resistance of the battery pack 105 using the total voltage $V_{PACK}$ and a first load current, and determine whether the computed first actual total resistance is equal to a theoretic resistance.

Figure 9:
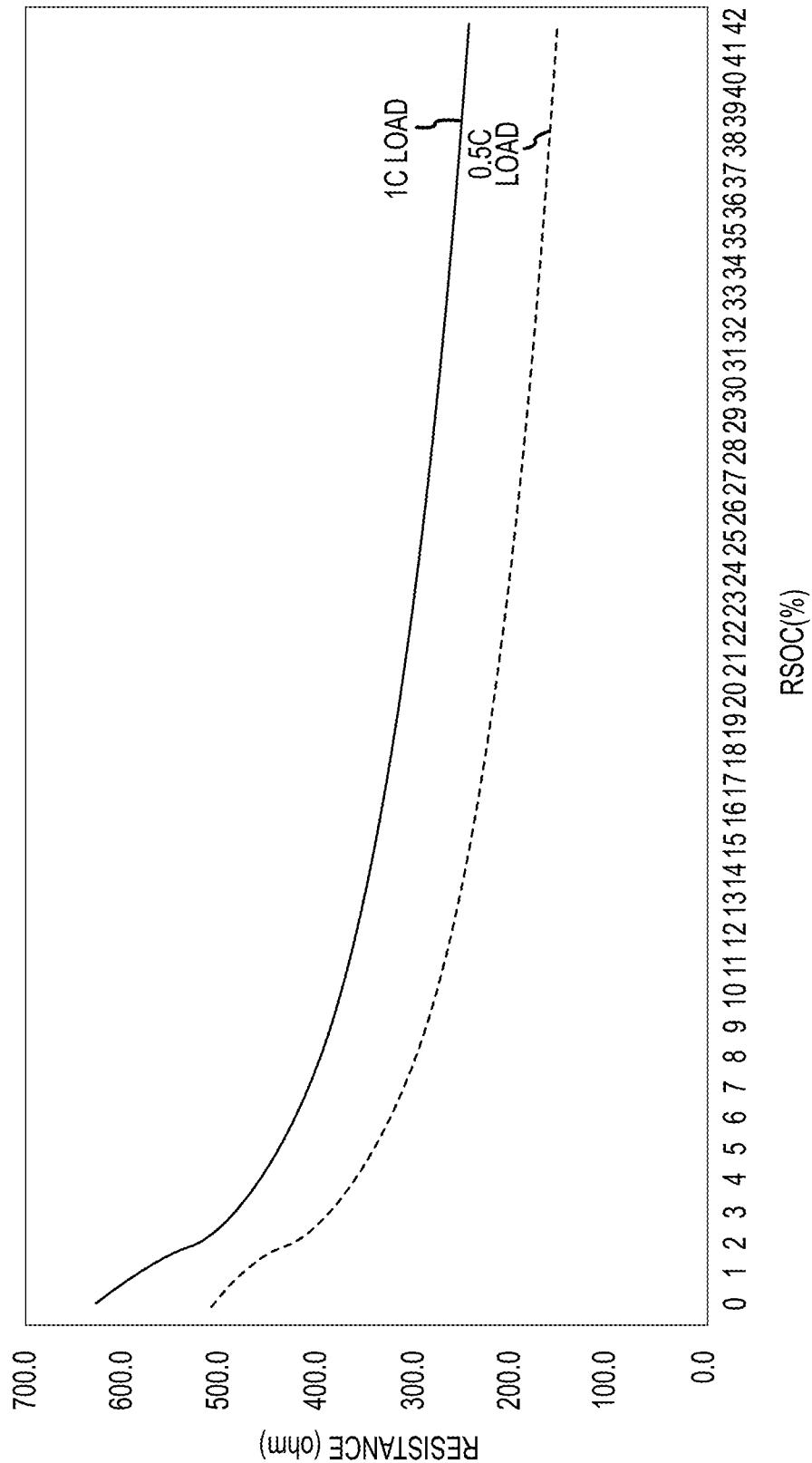
FIG. 9 is a graph of the values from the table of FIG. 8 and in accordance with an exemplary embodiment of the present technology.

The processor 150 may be configured to store the set of equations and use them to determine the capacity of the first battery cell 120 and the capacity of the second battery cell 125. The set of equations may comprise a first function describing a first resistance versus capacity curve at a first current parameter (e.g., the curve illustrated as a solid line in FIG. 9), and a second function describing a second resistance versus capacity curve at a second current parameter (e.g., the curve illustrated as a dashed line in FIG. 9). For example, at the first current parameter (e.g., 1 C load), the function of the first curve may be described by: $y=98(6-\log_{2.9}(x))$, and at the second current parameter (e.g., 0.5 C load), the function of the second curve may be described by: $y=102(5-\log_{3.2}(1.4x))$. The first and second current parameters may be defined by a C-rate, where the C-rate is a measure of the rate at which a battery is being charged or discharged, and is defined as the current though the battery divided by a theoretical current draw under which the battery would deliver its nominal rated capacity in one hour.

At 1 C load, the battery pack 105 should be able to provide 1 A to a load for one hour, and at 0.5 C load, the battery pack 105 should be able to provide 500 mA to a load for two hours. The processor 150 may also store an equation that describes a total capacity as the sum of the second capacity and the third capacity (i.e., total capacity=second capacity+ third capacity).

The processor 150 may be further configured to determine the amount of imbalance. For example, the processor 150 may be configured to compute the second actual resistance of the battery pack 105 using the measured total voltage $V_{PACK}$ and a second load current, and compute the second capacity of the first battery cell 120 and the third capacity of the second battery cell 125 using the computed first actual resistance $R_{PACK1}$, the computed second actual resistance $R_{PACK2}$, and the set of equations.

The fuel gauge circuit 110 may further comprise a load control circuit 130 configured to operate in conjunction with the charger 115 to control charging and discharging operations of the battery pack 105. For example, the load control circuit 130 may ensure that the battery pack 105 current is 1 A, 500 mA, or any other desired current. If the battery pack 105 is charging, the load control circuit 130 may transmit a signal to the charger 115 to indicate that the charger 115 should provide a particular charging current level to the battery pack 105. In an exemplary embodiment, the load control circuit 130 may be responsive to the processor 150. For example, the load control circuit 130 may adjust the current of the battery pack 105 to a desired level based on whether or not the fuel gauge circuit 110 is performing balance/imbalance detection. The load control circuit 130 may comprise any circuit and/or device suitable for interfacing between the fuel gauge circuit 110 and the charger 115 and providing current level instructions to the charger 115.

Figures 2A, 2B:
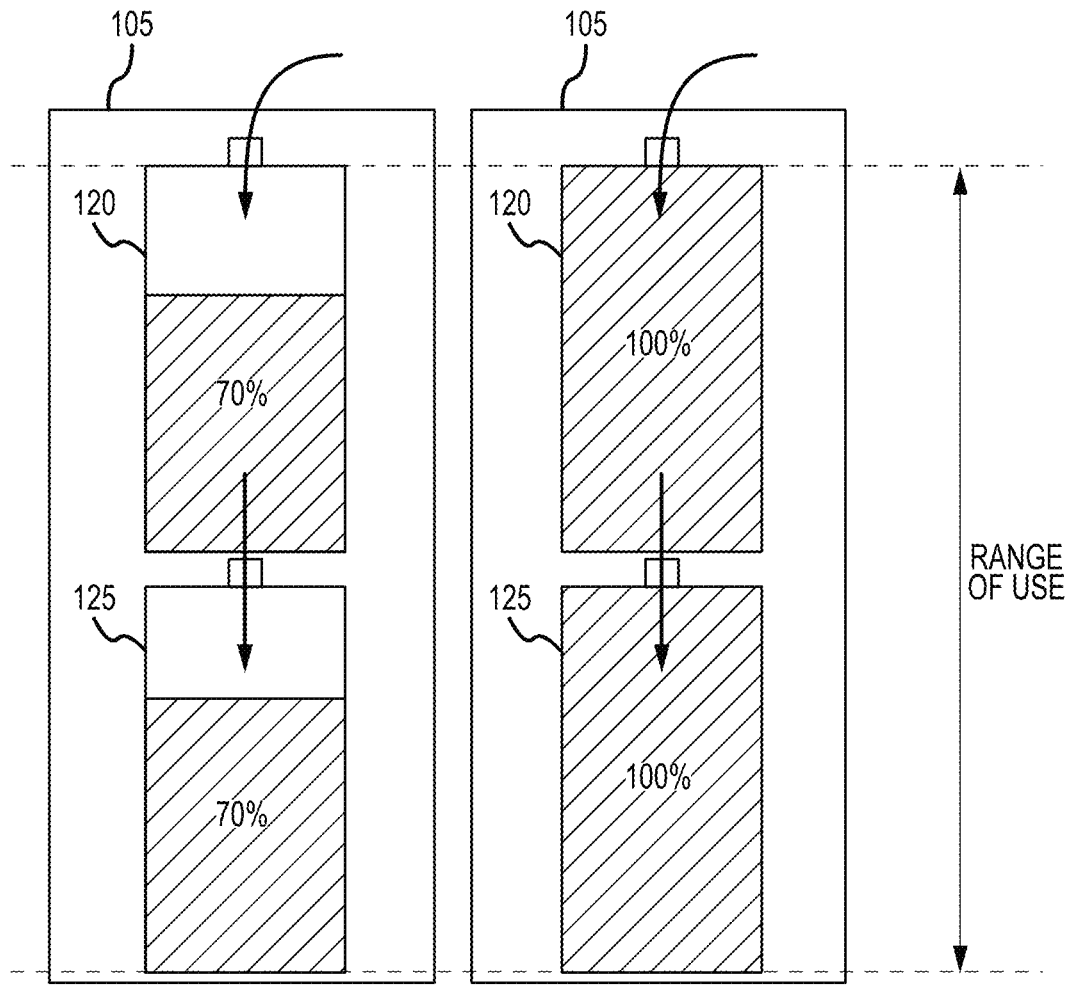
Figures 3A, 3B:
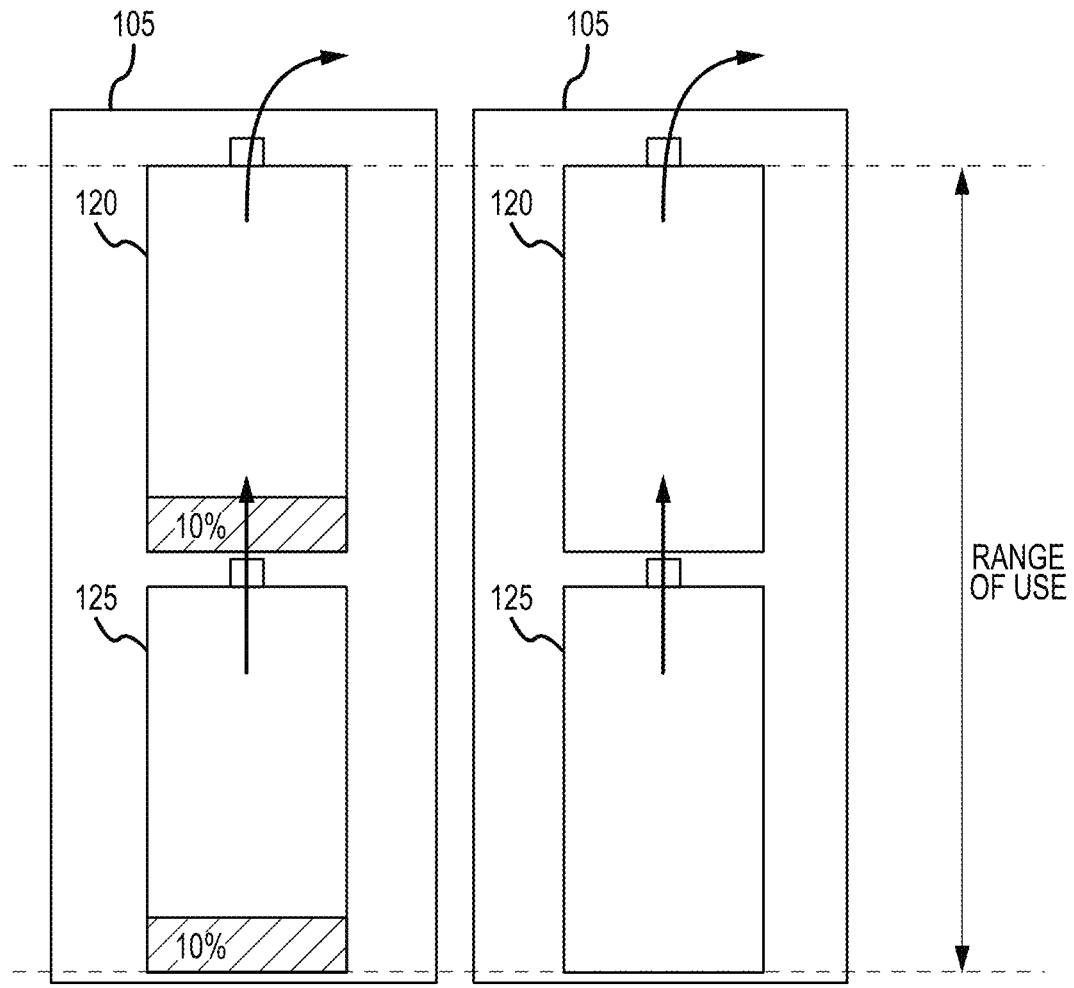

In general, and referring to FIGS. 2-3, when two series-connected batteries are balanced, charging of the battery cells 120, 125 results in each battery cell being charged to 100% capacity (e.g., as illustrated in FIGS. 2A-2B). In addition, when the series-connected battery cells 120, 125 are balanced, discharging of the battery cells 120, 125 results in each battery cell being discharged at the same rate such that each battery cell discharges to 0% capacity (e.g., as illustrated in FIGS. 3A-3B).

Figures 4A, 4B:
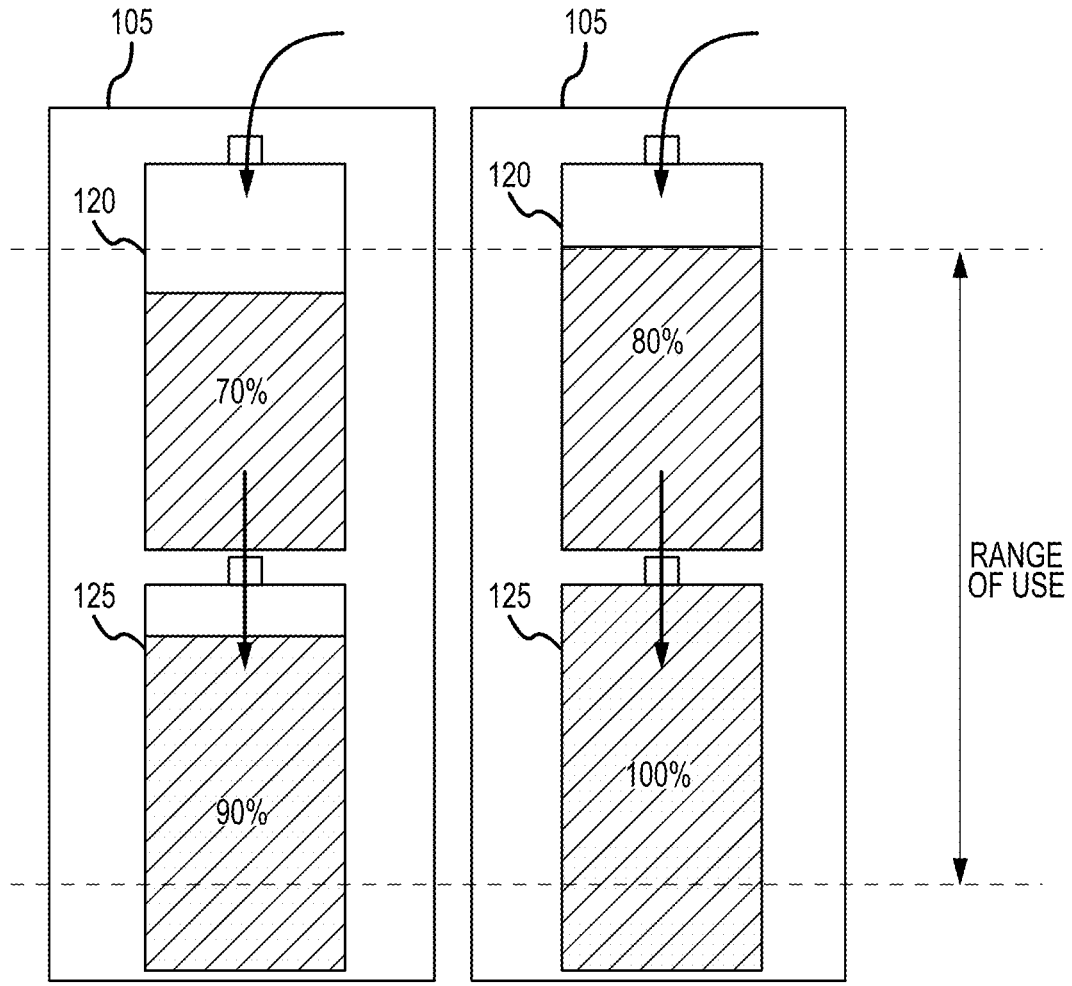
Figures 5A, 5B:
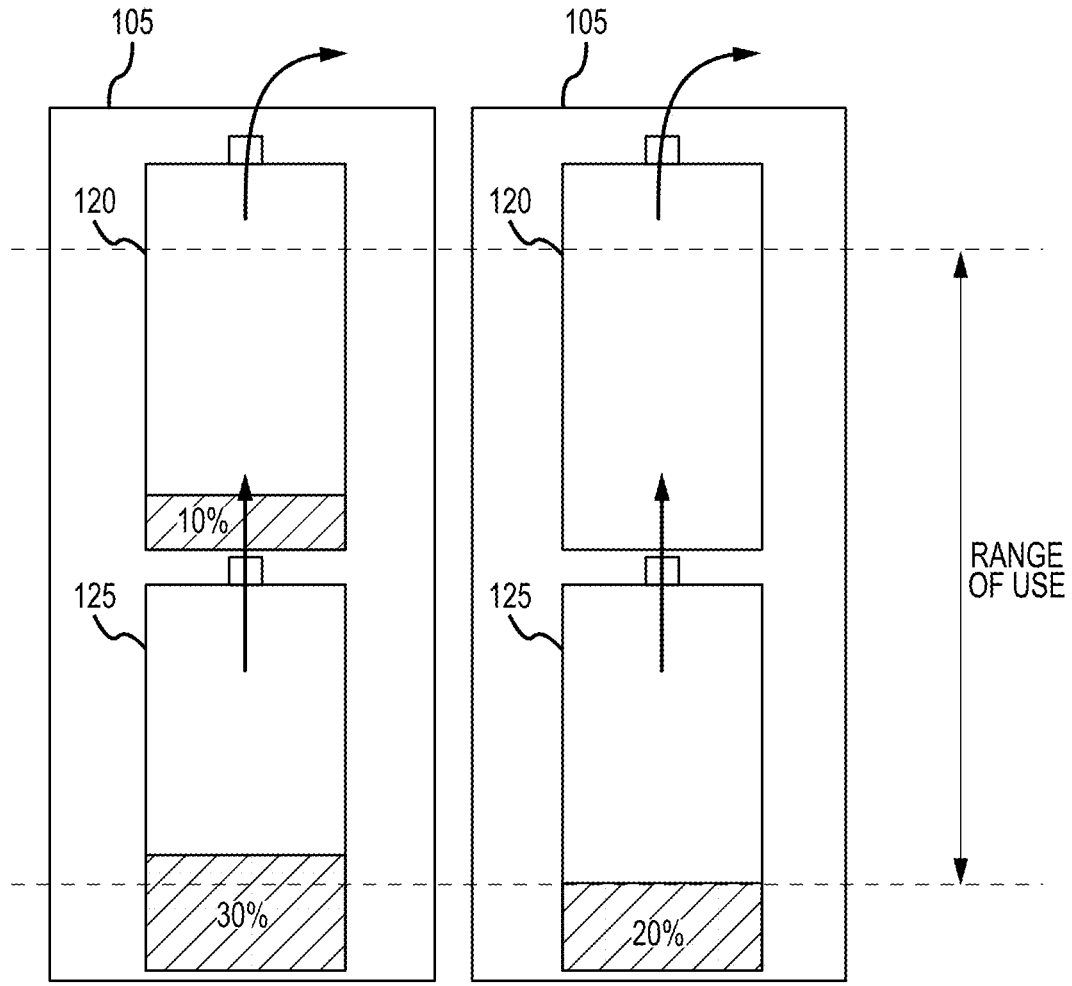
Figure 6:
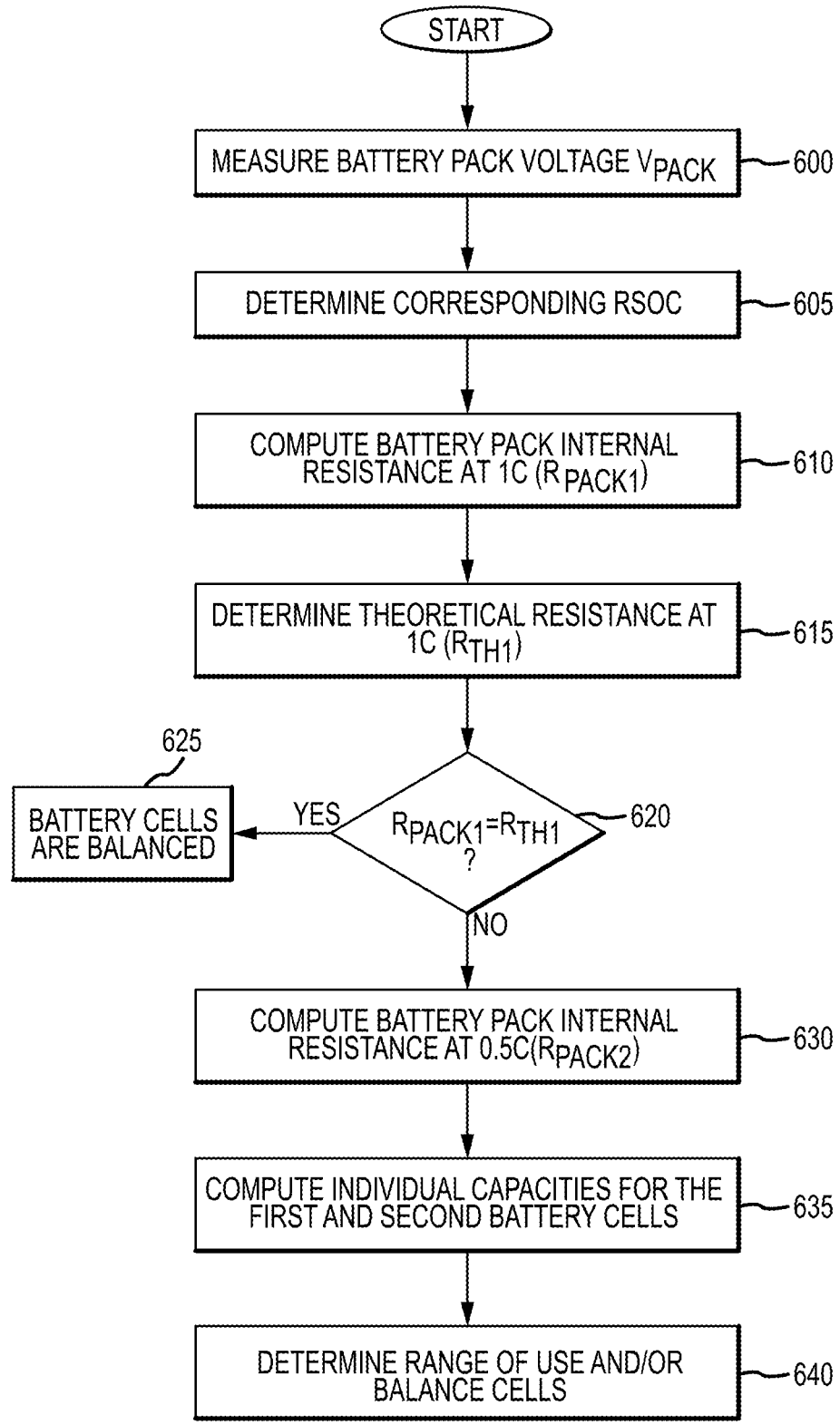
FIG. 6 is a flow chart for detecting imbalance and determining an amount of imbalance between two series-connected battery cells in accordance with an exemplary embodiment of the present technology.

In contrast, and referring to FIGS. 4-5, when two series-connected battery cells 120, 125 are imbalanced, charging results in one battery cell being charged to 100%, while the other battery cell is less than 100% (e.g., as illustrated in FIGS. 4A-4B). In addition, when the series-connected battery cells 120, 125 are imbalanced, discharging of the battery cells results in one battery cell being discharged to 0% while the other battery cell is greater than 0% (e.g., as illustrated in FIGS. 5A-5B).

In various embodiments, the range of use of the battery pack 105 includes the combined capacity of both battery cells 120, 125. When the battery cells 120, 125 are balanced, the range of use is at a maximum. However, when the battery cells 120, 125 are imbalanced, the range of use is limited.

In operation, and referring to FIGS. 1-8, the system 100 may be configured to detect an imbalance between the first battery cell 120 and the second battery cell 125. In an exemplary embodiment, the fuel gauge circuit 110 may measure the total voltage $V_{PACK}$ of the series-connected battery cells (600) (e.g., the voltage detector 140 may measure the total voltage $V_{PACK}$), determine a capacity based on the measured total voltage and a first battery characteristic data (605) (e.g., the processor 150 may retrieve a capacity value corresponding to the measured total voltage $V_{PACK}$ from the memory 135); compute the first actual resistance of the series-connected battery pack $R_{PACK1}$ using the measured total voltage $V_{PACK}$ and a first load current $I_{DD}$, such as 1 A, (610) (e.g., the processor 150 may compute the first actual resistance $R_{PACK1}$ based on the measured total voltage $V_{PACK}$ and the load current using Ohm's law–$R_{PACK1}=V_{PACK}/I_{DD}$); obtain a theoretical resistance $R_{TH1}$ based on the determined capacity (615) (e.g., the processor 150 may retrieve the theoretical resistance $R_{TH1}$ corresponding to the capacity from the memory 135); determine whether the computed first actual total resistance $R_{PACK1}$ is equal to the theoretic resistance (620) (e.g., the processor 150 may compare the first actual total resistance $R_{PACK1}$ to the theoretical resistance $R_{TH1}$); generate a first signal if the computed first actual total resistance is equal to the theoretic resistance, wherein the first signal indicates that the series-connected battery cells are balanced (625) (e.g., the processor 150 may generate the first signal and transmit it to the load control circuit 130); and generate a second signal if the computed first actual total resistance is not equal to the theoretic resistance, wherein the second signal indicates that the series-connected battery cells are imbalanced (e.g., the processor 150 may generate the second signal and transmit it to the load control circuit 130). In a case where the battery cells 120, 125 are imbalanced, the fuel gauge circuit 110 may initiate a conventional cell balancing technique (640).

In various embodiments, the system 100 may be further configured to determine the amount of imbalance between the battery cells 120, 125. In an exemplary embodiment, the fuel gauge circuit 110 may compute a second actual resistance of the series-connected battery pack $R_{PACK2}$ using the measured total voltage $V_{PACK}$ and a second load current, such as 500 mA (630) (e.g., the processor 150 may compute the second actual resistance $R_{PACK2}$ based on the measured total voltage $V_{PACK}$ and the load current using Ohm's law); and compute a capacity for each series-connected battery cell using the computed first actual resistance $R_{PACK1}$, the computed second actual resistance $R_{PACK2}$, and a set of equations (635). The set of equations may comprise functions such as $y=98(6-\log_{2.9}(x))$ and $y=102(5-\log_{3.2}(1.4x))$, where y is the resistance of a battery cell and x is the capacity. The functions may be determined according to the particular resistance versus capacity characteristics of the battery cells and the relationship may be determined during testing when the battery cell is new. Also, it may be given that the combined resistance for both battery cells is equal to the resistance of the first battery cell having a capacity $x_a$ plus the resistance of the second battery cell having a capacity $x_b$ (i.e., combined resistance=$98(6-\log_{2.9}(x_a))+98(6-\log_{2.9}(x_b))$) at the first load current. It may also be given that the combined resistance for both battery cells is equal to the resistance of the first battery cell having a capacity $x_a$ plus the resistance of the second battery cell having a capacity $x_b$ (i.e., combined resistance=$102(5-\log_{3.2}(1.4x_a))+102(5-\log_{3.2}(1.4x_b))$) at the second load current. The processor 150 may also retrieve a capacity value from the memory 135 that assumes that the battery cells 120, 125 are balanced. For example, the measured total voltage $V_{PACK}$ may be 7.2V. In this case, each battery cell would be 3.6V if they were balanced, and the capacity corresponding to 3.6V (e.g., using relational data from FIG. 7) is 20%. Therefore, in the balanced case, it follows that $(x_a+x_b)/2=20$.

For example, assuming the first actual resistance $R_{PACK1}$ is 651 ohms and the second actual resistance $R_{PACK2}$ is 460.8 ohms, it is given that:

$$651=98(6-\log_{2.9}(x_a))+98(6-\log_{2.9}(x_b)) \quad \text{(equation 1)};$$

$$460.8=102(5-\log_{3.2}(1.4x_a))+102(5-\log_{3.2}(1.4x_b)) \quad \text{(Equation 2); and}$$

$$(x_a+x_b)/2=20 \quad \text{(equation 3)}.$$

The processor 150 may then use equations 1, 2, and 3 to solve for $x_a$ and $x_b$. In this example, $x_a=10$ and $x_b=30$. This means that one battery cell has a capacity of 10% while the other battery cell has capacity of 30% and that the cell imbalance gap is 20%. This also means that the range of use of the battery pack 105 is 80%. In a case where the amount of battery cell imbalance is known, the load control circuit 130 and charger 115 may operate together to prevent overcharging and over-discharging of the battery cells 120, 125 by limiting charging and discharging operations to be commensurate with the range of use (640).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus capable of connecting to a battery pack, wherein the battery pack includes a first battery cell connected in series with a second battery cell, and has a first terminal and a second terminal, comprising:
 a fuel gauge circuit configured to connect to the first terminal and the second terminal, and comprising:
  a voltage detector configured to measure a total voltage of the battery pack;
  a memory configured to store a first battery characteristic data indicating a relationship between open circuit voltage and capacity; and
  a processor, in communication with the voltage detector and the memory, and configured to detect imbalance between the series-connected battery cells, comprising:
   determine a first capacity based on the measured total voltage and the first battery characteristic data;
   compute a first actual resistance of the battery pack using the measured total voltage and a first load current;
   determine whether the computed first actual total resistance is equal to a theoretic resistance;
   generating a first signal if the computed first actual total resistance is equal to the theoretic resistance, wherein the first signal indicates that the first and second battery cells are balanced;
   generating a second signal if the computed first actual total resistance is not equal to the theoretic resistance, wherein the second signal indicates that the first and second battery cells are imbalanced;
   compute a second actual resistance of the battery pack using the measured total voltage and a second load current; and
   compute a second capacity of the first battery cell and a third capacity of the second battery cell using the computed first actual resistance, the computed second actual resistance, and a set of equations.

2. The apparatus according to claim 1, wherein the memory is further configured to store a second battery characteristic data indicating a relationship between capacity, internal resistance, and current.

3. The apparatus according to claim 2, wherein the theoretic resistance is selected from the second battery characteristic data.

4. The apparatus according to claim 1, wherein the total voltage is the sum of a first voltage of the first battery cell and a second voltage of the second battery cell.

5. The apparatus according to claim 1, wherein determining the first capacity comprises selecting a capacity from the first battery characteristic data that corresponds to the measured total voltage.

6. The apparatus according to claim 1, wherein the set of equations comprises:
 a first function describing a first resistance versus capacity curve with a first current parameter; and
 a second function describing a second resistance versus capacity curve with a second current parameter.

7. The apparatus according to claim 1, wherein the set of equations comprises an equation that describes a total capacity as the sum of the second capacity and the third capacity.

* * * * *